US012684721B2

(12) United States Patent
Shen et al.

(10) Patent No.: US 12,684,721 B2
(45) Date of Patent: Jul. 14, 2026

(54) DISPLAY APPARATUS

(71) Applicant: BOE Technology Group Co., Ltd., Beijing (CN)

(72) Inventors: Youqing Shen, Beijing (CN); Houkun Zhu, Beijing (CN); Qiang Wu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 272 days.

(21) Appl. No.: 18/710,893

(22) PCT Filed: Aug. 4, 2023

(86) PCT No.: PCT/CN2023/111222

§ 371 (c)(1),
(2) Date: May 16, 2024

(87) PCT Pub. No.: WO2025/030259

PCT Pub. Date: Feb. 13, 2025

(65) Prior Publication Data

US 2026/0173290 A1      Jun. 18, 2026

(51) Int. Cl.
*H05K 5/06*          (2006.01)
*H05K 5/02*          (2006.01)
*H05K 5/03*          (2006.01)

(52) U.S. Cl.
CPC ............. *H05K 5/06* (2013.01); *H05K 5/0217* (2013.01); *H05K 5/03* (2013.01)

(58) Field of Classification Search
None
See application file for complete search history.

(56) References Cited

U.S. PATENT DOCUMENTS 6,043,977 A * 3/2000 Nakajima ............. G06F 1/1616
                                                   361/679.48
6,084,769 A * 7/2000 Moore .................... G06F 1/203
                                                   361/679.52

(Continued)

FOREIGN PATENT DOCUMENTS

CN          205883827 U     1/2017
CN          107995971 A     5/2018

(Continued)

OTHER PUBLICATIONS

International Search Report & Written Opinion mailed Apr. 30, 2024, regarding PCT/CN2023/111222.

*Primary Examiner* — Xanthia C Relford
(74) *Attorney, Agent, or Firm* — Intellectual Valley Law, P.C.

(57)          ABSTRACT

A display apparatus is provided. The display apparatus includes a housing; a first cover plate; a second cover plate; a back plate; a first chamber between the housing and the first cover plate; a second chamber between the first cover plate and the second cover plate; and a third chamber between the second cover plate and the back plate. The first chamber is a waterproof chamber. The third chamber is a waterproof chamber. The display apparatus further includes a second opening extending through the first cover plate; a third opening extending through the second cover plate; a first sealing ring; and a second sealing ring. The second opening and the third opening are aligned and connected to each other, establishing a connection between the first chamber and the third chamber. The first sealing ring and a second sealing ring are configured to waterproof the second opening and the third opening.

20 Claims, 11 Drawing Sheets

(56) References Cited

U.S. PATENT DOCUMENTS

| | | | | |
|---|---|---|---|---|
| 6,822,856 B2 * | 11/2004 | Fujiwara | G06F 1/203 | |
| | | | | 361/679.48 |
| 7,872,864 B2 * | 1/2011 | Mongia | G06F 1/203 | |
| | | | | 361/695 |
| 8,559,173 B2 * | 10/2013 | Fujiwara | G06F 1/20 | |
| | | | | 361/679.48 |
| 8,619,419 B2 * | 12/2013 | Zimmermann | G06F 1/1632 | |
| | | | | 361/679.48 |
| 8,760,862 B2 * | 6/2014 | Wang | G06F 1/203 | |
| | | | | 361/679.48 |
| 9,310,860 B2 * | 4/2016 | Anuez | G06F 1/181 | |
| 12,342,504 B2 * | 6/2025 | Huang | H05K 7/20336 | |
| 2002/0053421 A1 * | 5/2002 | Hisano | G06F 1/203 | |
| | | | | 165/104.33 |
| 2008/0019093 A1 * | 1/2008 | Hongo | G06F 1/203 | |
| | | | | 361/693 |
| 2015/0230356 A1 * | 8/2015 | Shinoda | G06F 1/1656 | |
| | | | | 455/575.8 |
| 2016/0301997 A1 * | 10/2016 | Shindo | G06F 1/1626 | |
| 2022/0311849 A1 | 9/2022 | Jia | | |
| 2023/0077374 A1 | 3/2023 | Yang | | |

FOREIGN PATENT DOCUMENTS

| | | | |
|---|---|---|---|
| CN | 104737114 | B | 12/2018 |
| CN | 110718154 | A | 1/2020 |
| CN | 112769988 | A | 5/2021 |
| CN | 112991955 | A | 6/2021 |
| CN | 113497845 | A | 10/2021 |
| CN | 113741853 | A | 12/2021 |
| JP | 3192207 | U | 7/2014 |
| KR | 20220079369 | A | 6/2022 |

* cited by examiner

DISPLAY APPARATUS

CROSS-REFERENCE TO RELATED APPLICATION

This application is a national stage application under 35 U.S.C. § 371 of International Application No. PCT/CN2023/111222, filed Aug. 4, 2023, the contents of which are incorporated by reference in the entirety.

TECHNICAL FIELD

The present invention relates to display technology, more particularly, to a display apparatus.

BACKGROUND

Flexible displays have advantages such as being bendable and rollable, providing possibilities for the design of new form-factor display devices. A rollable display apparatus refers to a type of display technology that can be rolled or wrapped around an object (e.g., a cylindrical object) without damaging the screen or affecting its functionality. It typically consists of a flexible screen material that can be rolled and unrolled, allowing for easy portability and storage. Rollable display apparatuses offer the advantage of being highly flexible and versatile, providing users with the ability to adjust the size and shape of the display according to their needs.

SUMMARY

In one aspect, the present disclosure provides a display apparatus, comprising a housing; a first cover plate; a second cover plate; a back plate; a first chamber between the housing and the first cover plate; a second chamber between the first cover plate and the second cover plate; and a third chamber between the second cover plate and the back plate; wherein the first chamber is a waterproof chamber; and the third chamber is a waterproof chamber; wherein the display apparatus further comprises a second opening extending through the first cover plate; and a third opening extending through the second cover plate; wherein the third opening connects the first chamber and the third chamber; and the third opening is at least partially in the second opening.

Optionally, the second cover plate comprises a barrier and a main body, the barrier protruding away from the main body toward the first cover plate; and the barrier is in direct contact with the first cover plate, enclosing the second chamber.

Optionally, the display apparatus further comprises a concave groove extending into the second cover plate; wherein the barrier spaces apart the second chamber from the concave groove; a portion of the first cover plate extends into the concave groove, interlocking with the second cover plate; and the portion of the first cover plate extending into the concave groove is at least partially in contact with a first sealing ring and is at least partially in contact with a second sealing ring.

Optionally, the first cover plate comprises a first tubular structure protruding toward the second cover plate, the second opening being an opening of the first tubular structure; the second cover plate comprises a second tubular structure protruding toward the first cover plate, the third opening being an opening of the second tubular structure; and the second tubular structure is inserted into the first tubular structure.

Optionally, the display apparatus further comprises a first sealing ring and a second sealing ring between an inner wall of the first tubular structure and an outer wall of the second tubular structure, preventing water from passing through between the inner wall of the first tubular structure and the outer wall of the second tubular structure.

Optionally, the display apparatus further comprises a water storage space between the first sealing ring and the second sealing ring configured to further prevent water from passing through the second sealing ring.

Optionally, the display apparatus further comprises a mainboard received in the first chamber; an adapter board received in the third chamber; and a transfer flexible printed circuit connected to the mainboard received in the first chamber and connected to the adapter board received in the third chamber; wherein the transfer flexible printed circuit extends from the first chamber, through the third opening, and into the third chamber.

Optionally, the display apparatus further comprises a second bonding structure configured to fixedly attach the first cover plate to the housing, thereby forming the first chamber; wherein the housing further comprises a fourth groove configured to receive the second bonding structure.

Optionally, the display apparatus further comprises a third bonding structure configured to fixedly attach the back plate to the second cover plate, thereby forming the third chamber; wherein the second cover plate further comprises a fifth groove configured to receive the third bonding structure.

Optionally, the display apparatus further comprises a flexible display panel configured to transition between a folded state and an unfolded state; and a push rod: wherein the push rod and the housing are cooperatively configured to transition the flexible display panel between the folded state and the unfolded state; and the second chamber is configured to receive a portion of the flexible display panel.

Optionally, the flexible display panel bends about a support portion of the push rod; the push rod is slidably attached to the housing: the push rod is slidably movable relative to the housing; and the flexible display panel is configured to transition between the folded state and the unfolded state as the push rod slidably moves relative to the housing.

Optionally, the push rod is a push rod having a comb shape comprising multiple teeth; the housing comprises multiple slots configured to receive the multiple teeth of the push rod; and at least one of the multiple teeth of the push rod comprises a start-stop limit structure configured to define the limits of the slidable movement of the push rod relative to the housing.

Optionally, the display apparatus further comprises a first bonding structure configured to attach the flexible display panel to the housing; and the first bonding structure is configured to form a sealed chamber between the flexible display panel and the housing.

Optionally, the flexible display panel comprises a pad bending area; and the first bonding structure is configured to fixedly attach the pad bending area of the flexible display panel to a frame portion of the housing.

Optionally, the housing further comprises a second groove configured to at least partially receive the first bonding structure; and the first bonding structure at least partially extends into, and attaches to, the second groove of the housing.

Optionally, the display apparatus further comprises a push rod; and an outer casing attached to the housing and attached to the push rod; wherein the display apparatus has a first display area and a second display area; and the first display area is capable of sliding open to increase a total display area of the display apparatus, or retracting to decrease the total display area of the display apparatus; wherein the outer casing wraps around a portion of the flexible display panel that bends about the support portion of the push rod; the outer casing further wraps around at least a portion of the first display area when the portion of the first display area is retracted; and the outer casing further wraps around side edges of the flexible display panel.

Optionally, the outer casing comprises a first protrusion; the housing comprises a first groove; the first protrusion and the first groove are configured to interlock with each other, thereby attaching the outer casing to the housing; and the first groove is a blind groove.

Optionally, the display apparatus further comprises a coil spring; and a pin shaft; wherein the pin shaft is configured to attach the coil spring to the housing; the pin shaft is movably attached to the housing; a first portion of the coil spring is attached to the pin shaft, a second portion of the coil spring is attached to the flexible display panel, providing a tensioning mechanism for the flexible display panel; and the coil spring and the pin shaft are received in the second chamber.

Optionally, the second cover plate comprises a second protrusion; the housing comprises a third groove; the second protrusion and the third groove are configured to interlock with each other, securing the pin shaft; and the pin shaft passes through the coil spring, achieving fixation of the coil spring.

Optionally, the display apparatus further comprises a mainboard received in the first chamber; a first opening extending through a side of the housing; and a flexible printed circuit connected to the flexible display panel, and connected to the mainboard; wherein the flexible printed circuit extends through the first opening into the first chamber to connect to the mainboard.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a display apparatus that substantially obviate one or more of the problems due to limitations and disadvantages of the related art. In some embodiments, the display apparatus includes a housing; a first cover plate; a second cover plate; a back plate; a first chamber between the housing and the first cover plate; a second chamber between the first cover plate and the second cover plate; and a third chamber between the second cover plate and the back plate. Optionally, the first chamber is a waterproof chamber. Optionally, the third chamber is a waterproof chamber. Optionally, the display apparatus further comprises a second opening extending through the first cover plate; a third opening extending through the second cover plate; a first sealing ring; and a second sealing ring. Optionally, the second opening and the third opening are aligned and connected to each other, establishing a connection between the first chamber and the third chamber. Optionally, the first sealing ring and a second sealing ring are configured to waterproof the second opening and the third opening.

Figure 1:
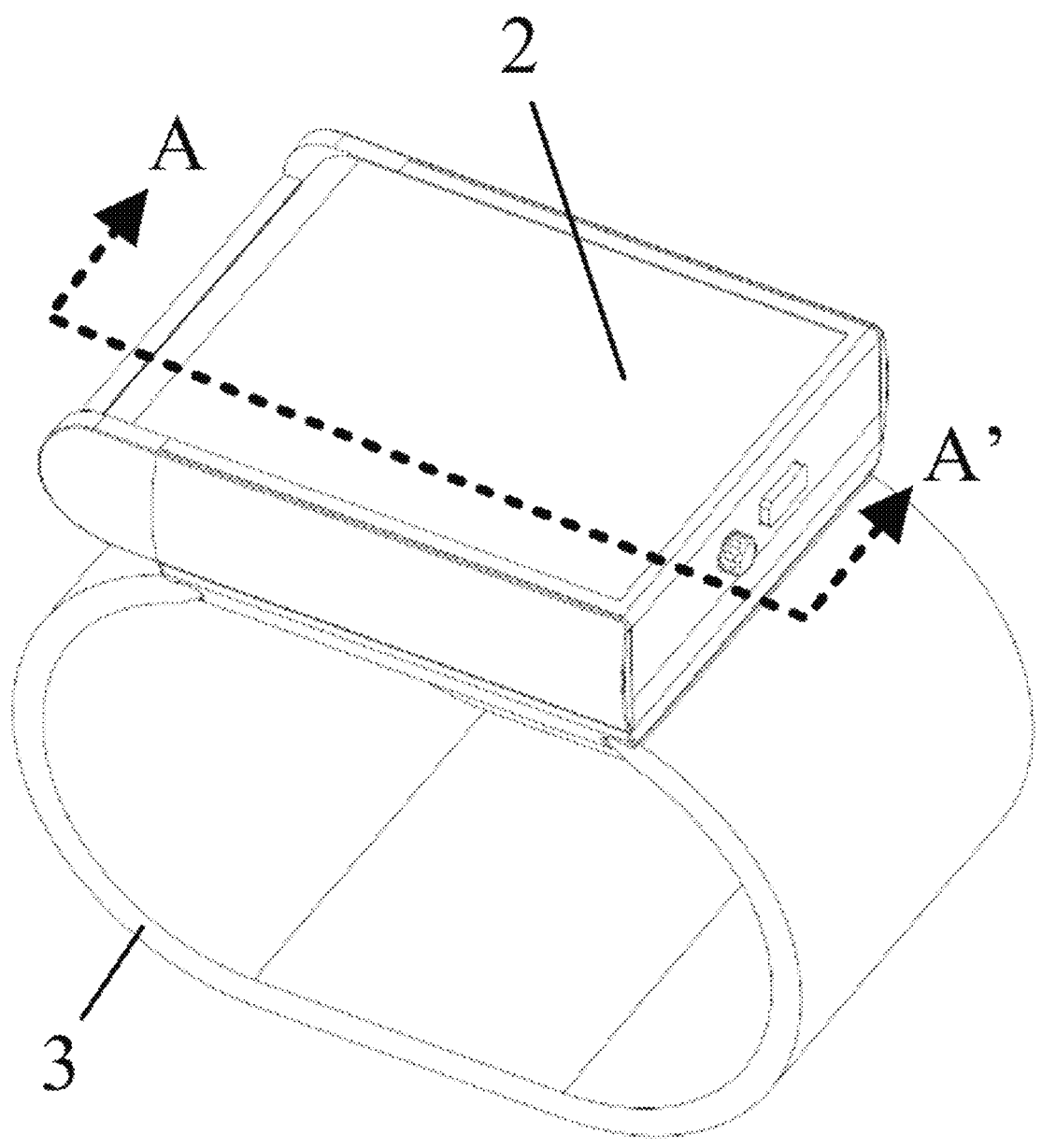
FIG. 1 is a diagram illustrating a folded state of a display apparatus in some embodiments according to the present disclosure.
Figure 2:
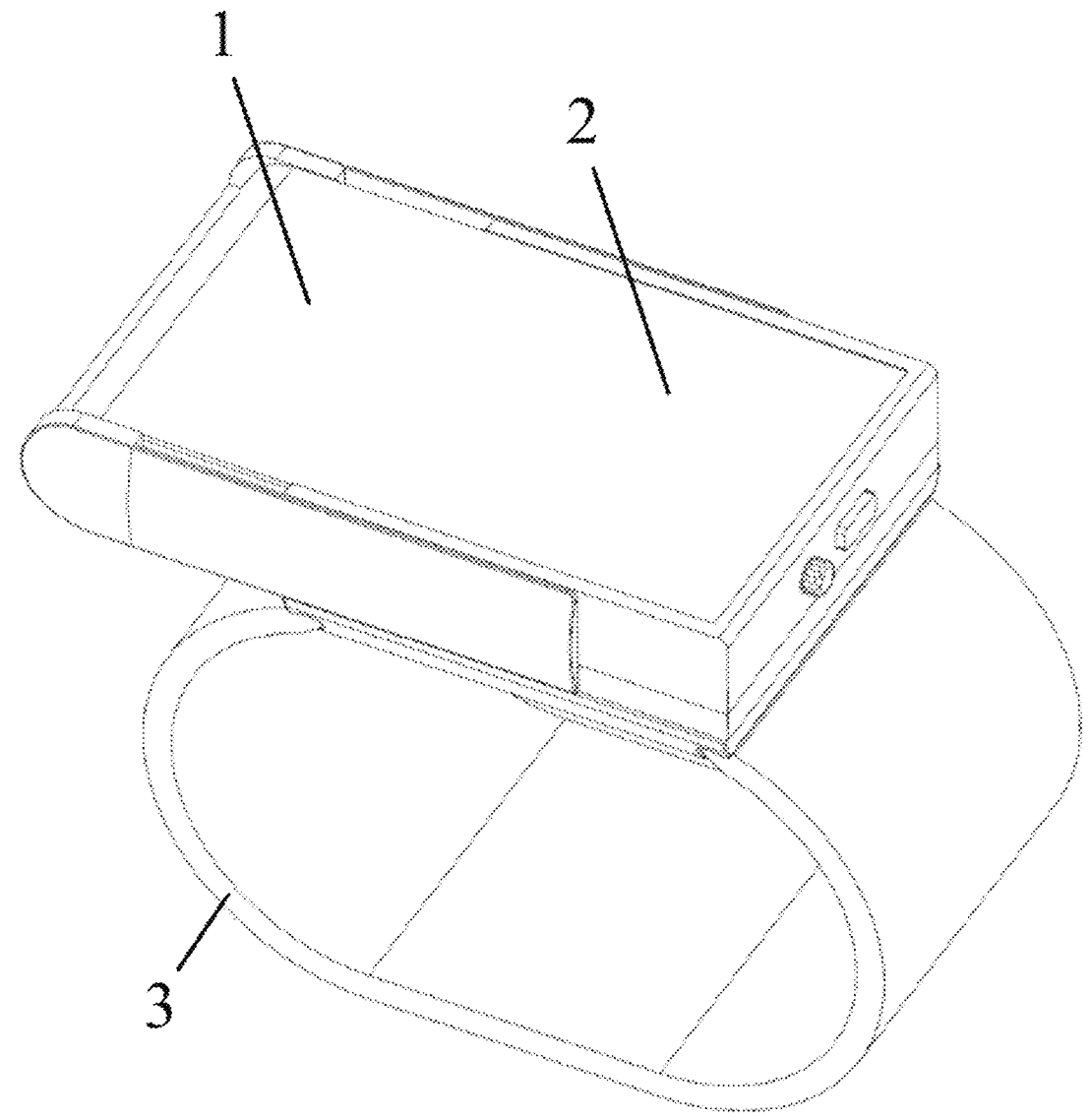
FIG. 2 is a diagram illustrating an unfolded state of a display apparatus in some embodiments according to the present disclosure.

FIG. 1 is a diagram illustrating a folded state of a display apparatus in some embodiments according to the present disclosure. FIG. 2 is a diagram illustrating an unfolded state of a display apparatus in some embodiments according to the present disclosure. A folded state refers to a configuration of a display apparatus when it is rolled or folded or collapsed into a smaller size or shape. In the folded state, the components or portions of the display apparatus are brought together to reduce its overall dimensions for storage, portability, or convenience. An unfolded state refers to the opposite configuration of the display apparatus when it is at least partially (e.g., fully) extended or unrolled or unfolded or expanded to an enlarged size or shape. In the unfolded state, the components or portions of the display apparatus are spread out or separated to achieve a larger surface area, and/or increased functionality, and/or improved usability. Referring to FIG. 1 and FIG. 2, the display apparatus has a first display area 1 and a second display area 2. In one example, the second display area 2 is a fixed display area, whereas the first display area 1 is a sliding-rolling display area. The display apparatus in the first display area 1 is capable of sliding open to increase a total display area of the display apparatus, or retracting to decrease the total display area of the display apparatus. The display apparatus in the second display area 2 does not undergo any sliding or rolling motion, thus does not induce a change the total display area of the display apparatus. The display apparatus in some embodiments further includes a wristband 3, which can be worn on the wrist to achieve the wearable functionality of the display apparatus.

Figure 3:
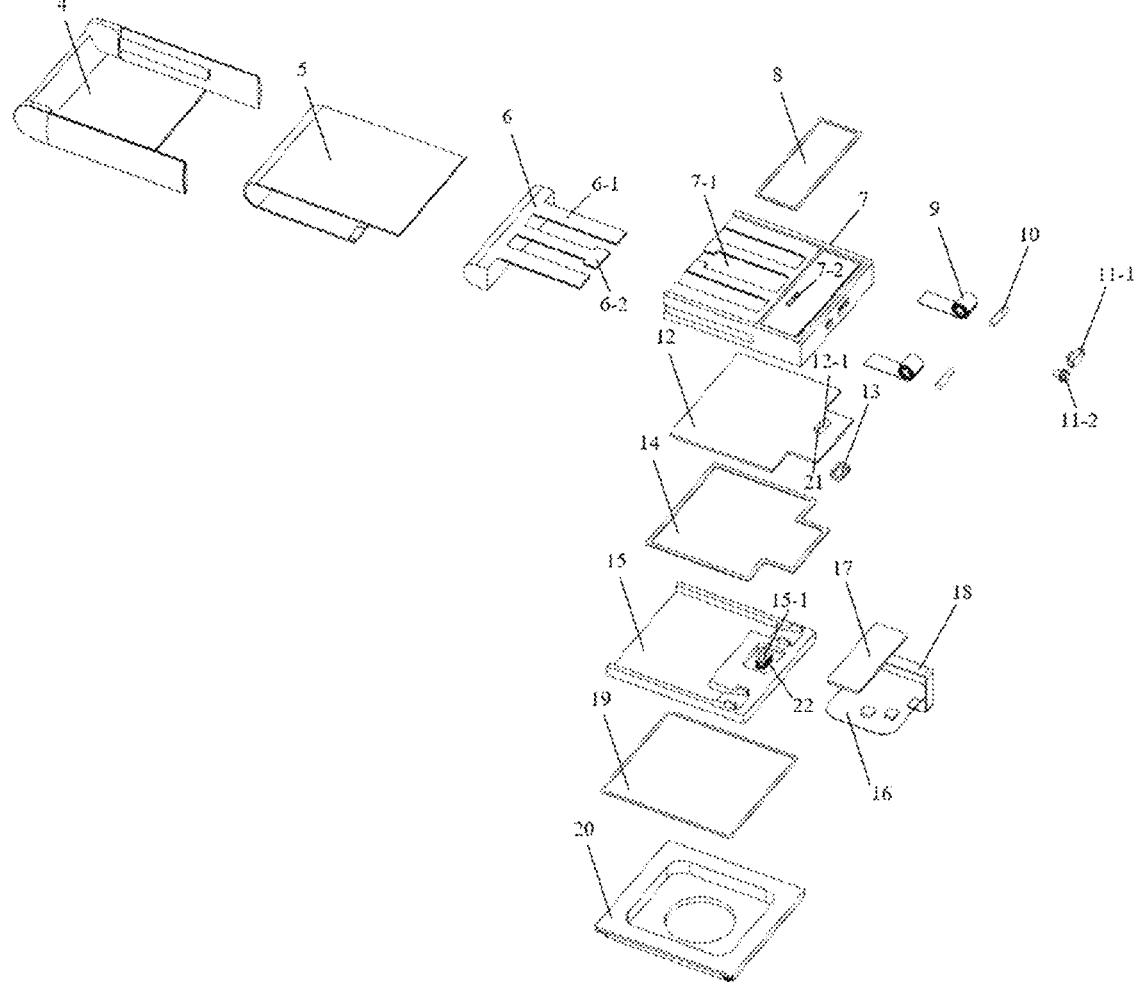
FIG. 3 is an exploded view of a display apparatus in some embodiments according to the present disclosure.

FIG. 3 is an exploded view of a display apparatus in some embodiments according to the present disclosure. Referring to FIG. 3, the display apparatus in some embodiments includes an outer casing 4, a flexible display panel 5, a push rod 6, and a housing 7.

In some embodiments, the push rod 6 and the housing 7 are cooperatively configured to transition the flexible display panel 5 between a folded state (see, e.g., FIG. 1) and an unfolded state (see, e.g., FIG. 2). In some embodiments, the outer casing 4 is attached to (e.g., movably attached to) the housing 7. In one example, the outer casing 4 is interlocked with the housing 7 (for example, snapped into the housing 7). In some embodiments, the outer casing 4 is attached to (e.g., fixedly attached to) the push rod 6. In one example, the outer casing 4 is bolted to the push rod 6.

In some embodiments, the flexible display panel 5 bends about a support portion of the push rod 6. In one example, the outer casing 4 wraps around a portion of the flexible display panel 5 that bends about the support portion of the push rod 6. Optionally, the outer casing 4 further wraps around at least a portion of the first display area when the portion of the first display area is retracted. Optionally, the outer casing 4 further wraps around side edges of the flexible display panel 5.

In some embodiments, the push rod 6 is slidably attached to the housing 7. Optionally, the push rod 6 is slidably movable relative to the housing 7. In some embodiments, the push rod 6 is a push rod having a comb shape comprising multiple teeth 6-1. In some embodiments, the housing 7 includes multiple slots 7-1 configured to receive the multiple teeth 6-1 of the push rod 6. In some embodiments, the outer casing 4 moves along with the push rod 6 as the push rod 6 slidably moves relative to the housing 7. The flexible display panel 5 is configured to transition between the folded state and the unfolded state as the push rod 6 slidably moves relative to the housing 7.

In some embodiments, the push rod 6 includes a start-stop limit structure 6-2 configured to define the limits of the slidable movement of the push rod 6 relative to the housing 7. For example, the start-stop limit structure 6-2 is configured to prevent excessive extension of the push rod 6. In one example, at least one of the multiple teeth 6-1 of the push rod 6 includes the start-stop limit structure 6-2, as depicted in FIG. 3.

Referring to FIG. 3, the display apparatus in some embodiments further includes a first bonding structure 8 configured to fixedly attach the flexible display panel 5 to the housing 7. Optionally, the first bonding structure 8 is configured to form a sealed chamber between the flexible display panel 5 and the housing 7, when the first bonding structure 8 attaches the flexible display panel 5 to the housing 7. In some embodiments, the flexible display panel 5 includes a pad bending area. Optionally, the first bonding structure 8 is configured to fixedly attach the pad bending area of the flexible display panel 5 to a frame portion of the housing 7. In one example, the first bonding structure 8 includes an adhesive material, e.g., a waterproof resin adhesive.

Referring to FIG. 3, the display apparatus in some embodiments further includes a coil spring 9 and a pin shaft 10. Optionally, the pin shaft 10 is configured to attach the coil spring 9 to the housing 7. Optionally, the pin shaft 10 is movably attached to the housing 7.

In some embodiments, the coil spring 9 is configured to provide tension to the flexible display panel 5. Optionally, the coil spring 9 is attached to a portion (e.g., an end portion) of the flexible display panel 5. In one example, the coil spring 9 is attached to the portion of the flexible display panel 5 by an adhesive.

Referring to FIG. 3, the display apparatus in some embodiments further includes a button 11-1 and a crown 11-2. The button 11-1 and the crown 11-2 are installed on the housing 7.

Referring to FIG. 3, the display apparatus in some embodiments further includes a first cover plate 12 configured to cover the housing 7. Optionally, the display apparatus further includes a second bonding structure 14 configured to fixedly attach the first cover plate 12 to the housing 7. In one example, the second bonding structure 14 includes an adhesive material, e.g., a waterproof resin adhesive.

Figure 4:
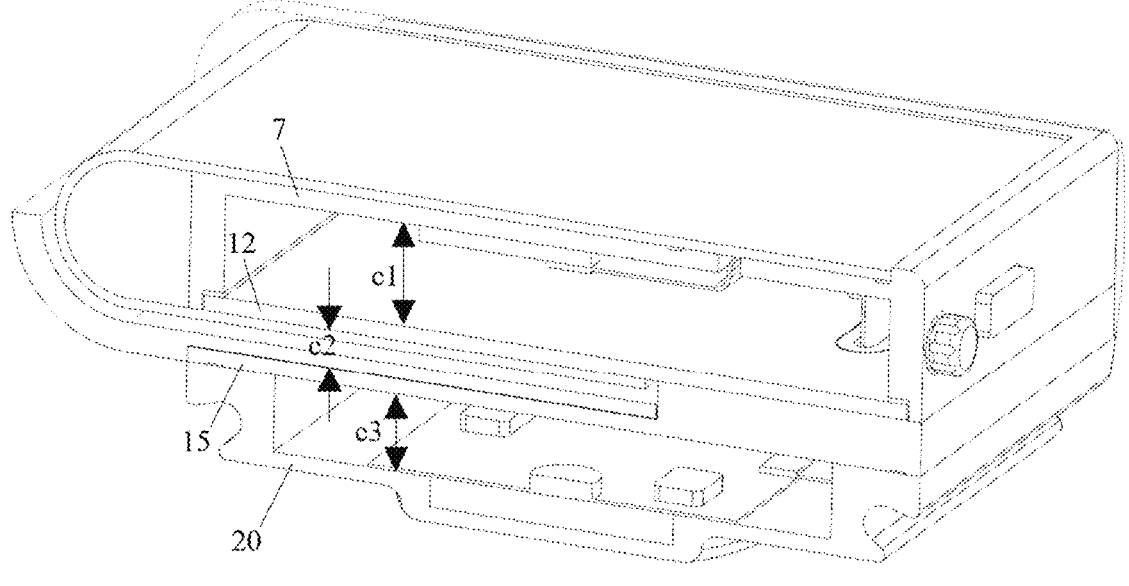
FIG. 4 is cross-sectional view along an A-A' line in FIG. 1, illustrating a first chamber, a second chamber, and a third chamber in a display apparatus in some embodiments according to the present disclosure.

FIG. 4 is a diagram illustrating a first chamber, a second chamber, and a third chamber in a display apparatus in some embodiments according to the present disclosure. Referring to FIG. 3 and FIG. 4, in some embodiments, the display apparatus further includes a first chamber c1 between the first cover plate 12 and the housing 7. The second bonding structure 14 is configured to seal the first chamber c1. In some embodiments, the display apparatus further includes a mainboard 17, and the first chamber c1 is configured to receive the mainboard 17. Optionally, the first chamber c1 is further configured to receive a battery, a motor, and/or other appropriate components. The first chamber c1 is waterproof.

In some embodiments, the display apparatus further includes a flexible printed circuit connected to the flexible display panel 5, and connected to the mainboard 17. In some embodiments, the flexible printed circuit enters into the first chamber c1 through a first opening 7-2 extending though a side of the housing 7, and connected to the mainboard 17 received in the first chamber c1.

Referring to FIG. 3, the display apparatus in some embodiments further includes a second cover plate 15 configured to cover at least a portion of the first display area when the portion of the first display area is retracted. In some embodiments, the second cover plate 15 is attached to the first cover plate 12. In one example, the second cover plate 15 is attached to the first cover plate 12 through a bolt. In another example, the second cover plate 15 is attached to the first cover plate 12 through glue or adhesive.

Referring to FIG. 3 and FIG. 4, in some embodiments, the display apparatus further includes a second chamber c2 between the first cover plate 12 and the second cover plate 15. Optionally, the second chamber c2 is configured to receive a portion of the flexible display panel 5. For example, when the flexible display panel 5 transitions from an unfolded state into a folded state, at least a portion of the flexible display panel 5 is received in the second chamber c2. In one example, at least a portion of the flexible display panel 5 corresponding to the first display area 1 is received in the second chamber c2 when the flexible display panel 5 transitions from the unfolded state into the folded state. In some embodiments, the second chamber c2 is further configured to receive the coil spring 9 and the pin shaft 10.

The second chamber c2 may be a sealed chamber or an unsealed chamber. In one example, the second chamber c2 is not sealed, for example, is not a waterproof chamber.

Referring to FIG. 3, the display apparatus in some embodiments further includes a back plate 20. Referring to FIG. 3 and FIG. 4, in some embodiments, the display apparatus further includes a third chamber c3 between the back plate 20 and the second cover plate 15. In some embodiments, the display apparatus further includes a third bonding structure 19 configured to fixedly attach the back plate 20 to the second cover plate 15. In some embodiments, the third bonding structure 19 is configured to form a sealed chamber (the third chamber c3) between the back plate 20 and the second cover plate 15, when the third bonding structure 19 attached the back plate 20 to the second cover plate 15. In one example, the third bonding structure 19 includes an adhesive material, e.g., a waterproof resin adhesive. The third chamber c3 is waterproof.

Referring to FIG. 3, the display apparatus in some embodiments further includes an adapter board 16. In some embodiments, the third chamber c3 is configured to receive the adapter board 16. Optionally, the third chamber c3 is further configured to receive one or more health monitoring sensors.

Referring to FIG. 3, the display apparatus in some embodiments further includes a second opening 12-1 extending through the first cover plate 12 and a third opening 15-1 extending through the second cover plate 15. Optionally, the first cover plate 12 includes a first tubular structure 21 protruding toward the second cover plate 15 (see, also, FIG. 15, FIG. 17, and FIG. 18). The second opening 12-1 is the opening of the first tubular structure 21. Optionally, the second cover plate 15 includes a second tubular structure 22 protruding toward the first cover plate 12 (see, also, FIG. 25, FIG. 17, and FIG. 18). The third opening 15-1 is the opening of the second tubular structure 22. Optionally, the second tubular structure 22 is inserted into the first tubular structure 21. As used herein, a cross-section of a tubular structure may have various appropriate shapes, for example, including irregular ring shapes, regular ring shapes, a circular ring shape, an oval ring shape, a rectangular ring shape, a snip corner rectangular ring shape, a round corner rectangular ring shape, a square ring shape, a polygonal ring shape, and an elliptical ring shape. The tubular structure may have uniform or non-uniform cross-section along its length. Shapes and/or sizes of the cross-sections of the tubular structure may vary along its length. A length of the tubular structure may be greater than, equal to, or less than a width of the tubular structure.

Referring to FIG. 3, the display apparatus in some embodiments further includes a transfer flexible printed circuit 18. In some embodiments, the transfer flexible printed circuit 18 is connected to the mainboard 17 received in the first chamber c1, and is connected to the adapter board 16 received in the third chamber c3. Optionally, the transfer flexible printed circuit 18 extends from the first chamber c1, through the third opening 15-1, and then into the third chamber c3.

Referring to FIG. 3, the display apparatus in some embodiments further includes one or more sealing rings 13 (e.g., a first sealing ring and a second sealing ring) between an inner wall of the first tubular structure 21 and an outer wall of the second tubular structure 22, preventing water from passing through a space between the inner wall of the first tubular structure 21 and the outer wall of the second tubular structure 22. Optionally, the one or more sealing rings 13 are in direct contact with the inner wall of the first tubular structure 21, and in direct contact with the outer wall of the second tubular structure 22.

Figure 5:
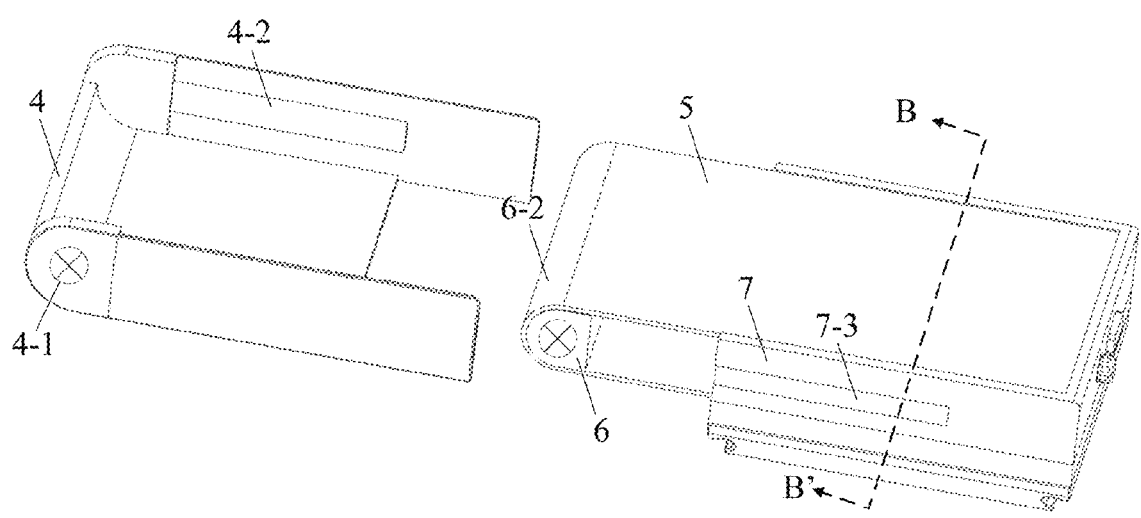
FIG. 5 is an exploded view illustrating an outer casing, a flexible display panel, a push rod, and a housing in a display apparatus in some embodiments according to the present disclosure.
Figure 6:
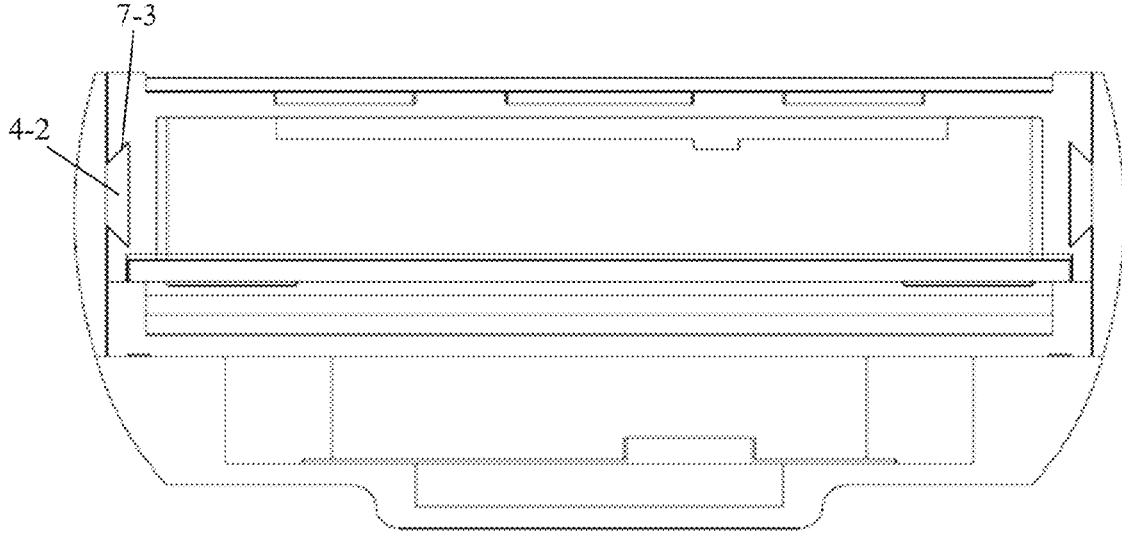
FIG. 6 is cross-sectional view along a B-B' line in FIG. 5 when the outer casing, the flexible display panel, the push rod, and the housing are assembled together.
Figure 7:
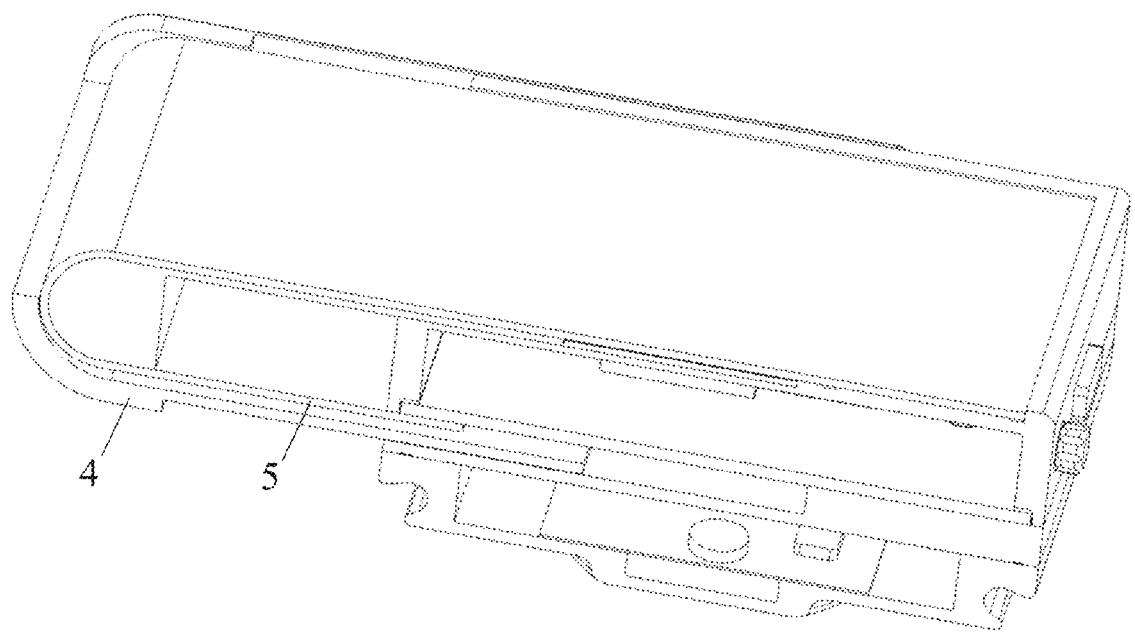
FIG. 7 is a diagram illustrating a part of a display apparatus in which an outer casing, a flexible display panel, a push rod, and a housing are assembled together.

FIG. 5 is an exploded view illustrating an outer casing, a flexible display panel, a push rod, and a housing in a display apparatus in some embodiments according to the present disclosure. FIG. 6 is cross-sectional view along a B-B' line in FIG. 5 when the outer casing, the flexible display panel, the push rod, and the housing are assembled together. FIG. 7 is a diagram illustrating a part of a display apparatus in which an outer casing, a flexible display panel, a push rod, and a housing are assembled together. As discussed above, in some embodiments, the push rod 6 and the housing 7 are cooperatively configured to transition the flexible display panel 5 between a folded state and an unfolded state. In some embodiments, the outer casing 4 is attached to (e.g., movably attached to) the housing 7. Referring to FIG. 5 to FIG. 7, the display apparatus in some embodiments further includes a bolt 4-1. In some embodiments, the outer casing 4 is attached to the push rod 6 by the bolt 4-1.

In some embodiments, the flexible display panel 5 bends about a support portion 6-2 of the push rod 6. In one example, the outer casing 4 wraps around a portion of the flexible display panel 5 that bends about the support portion 6-2 of the push rod 6, as depicted in FIG. 7.

In some embodiments, referring to FIG. 5 to FIG. 7, the outer casing 4 is attached to (e.g., movably attached to) the housing 7. In one example, the outer casing 4 is interlocked with the housing 7. In some embodiments, the outer casing 4 includes a first protrusion 4-2, and the housing 7 includes a first groove 7-3. The first protrusion 4-2 and the first groove 7-3 are configured to interlock with each other, thereby attaching the outer casing 4 to the housing 7. In one example, the first protrusion 4-2 is a dovetail-shaped protrusion, and the first groove 7-3 is a dovetail-shaped groove. In one example, the first groove 7-3 is a blind groove, e.g., the first groove 7-3 does not extend through a wall of the housing along the B-B' direction. The blind groove only partially extends into a wall of the housing 7.

In some embodiments, the first groove 7-3 extends only partially along a length direction of the wall of the housing 7. Optionally, the length direction of the wall of the housing 7 is substantially parallel to a direction of a slidable movement between the first protrusion 4-2 and the first groove 7-3. The inventors of the present disclosure discover that, by having the first groove 7-3 extending only partially along the length direction of the wall of the housing 7, when the display apparatus is in the unfolded state, the first groove 7-3 is not exposed. In one particular example as depicted in FIG. 2, the first groove 7-3 is completely covered by the outer casing 4 when the display apparatus is either in the unfolded state or in the folded state.

In alternative embodiments, the display apparatus further includes one or more ball bearings between the first protrusion 4-2 and the first groove 7-3. The one or more ball bearings can roll between the first protrusion 4-2 and the first groove 7-3, reducing the contact area and minimizing friction. The addition of the one or more ball bearings improves the smoothness and efficiency of the sliding motion.

In alternative embodiments, the display apparatus further includes a start-stop limit structure configured to define the limits of the slidable movement of the outer casing 4 relative to the housing 7. For example, the start-stop limit structure is configured to prevent excessive extension of the outer casing 4.

Figure 8:
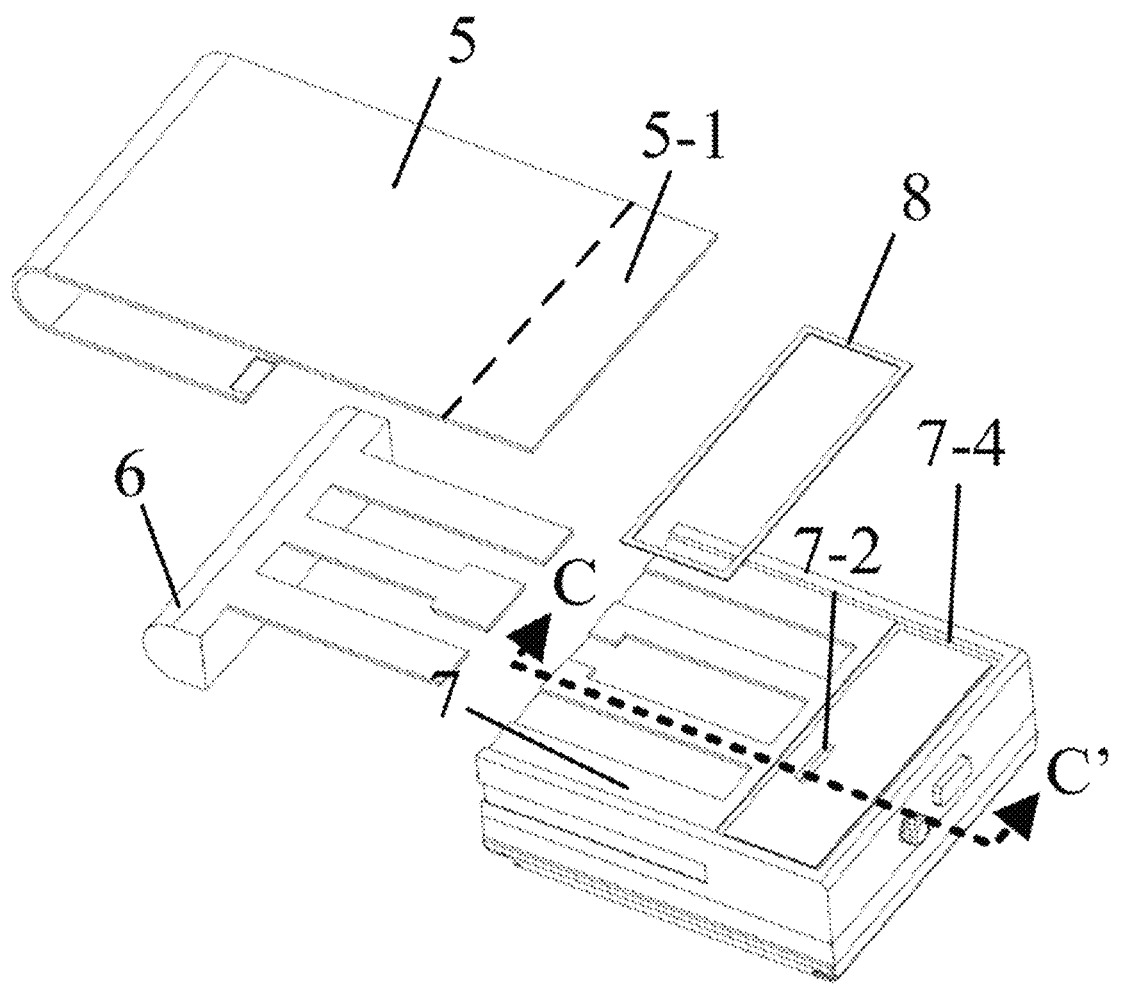
FIG. 8 is an exploded view of a flexible display panel, a push rod, a housing, and a first bonding structure in a display apparatus in some embodiments according to the present disclosure.
Figure 9:
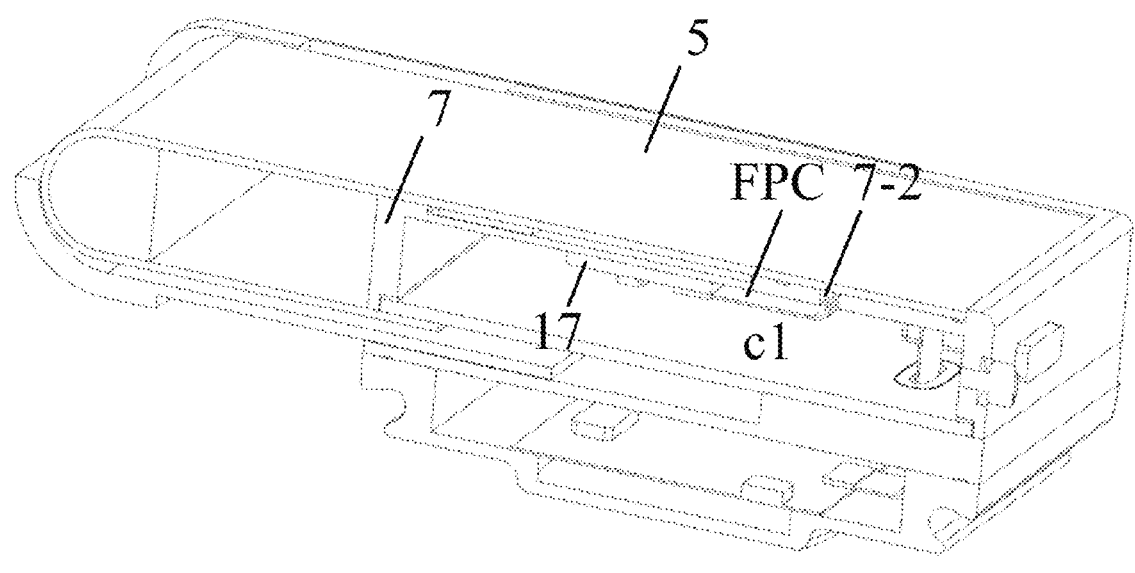
FIG. 9 is cross-sectional view along a C-C' line in FIG. 8.
Figure 10:
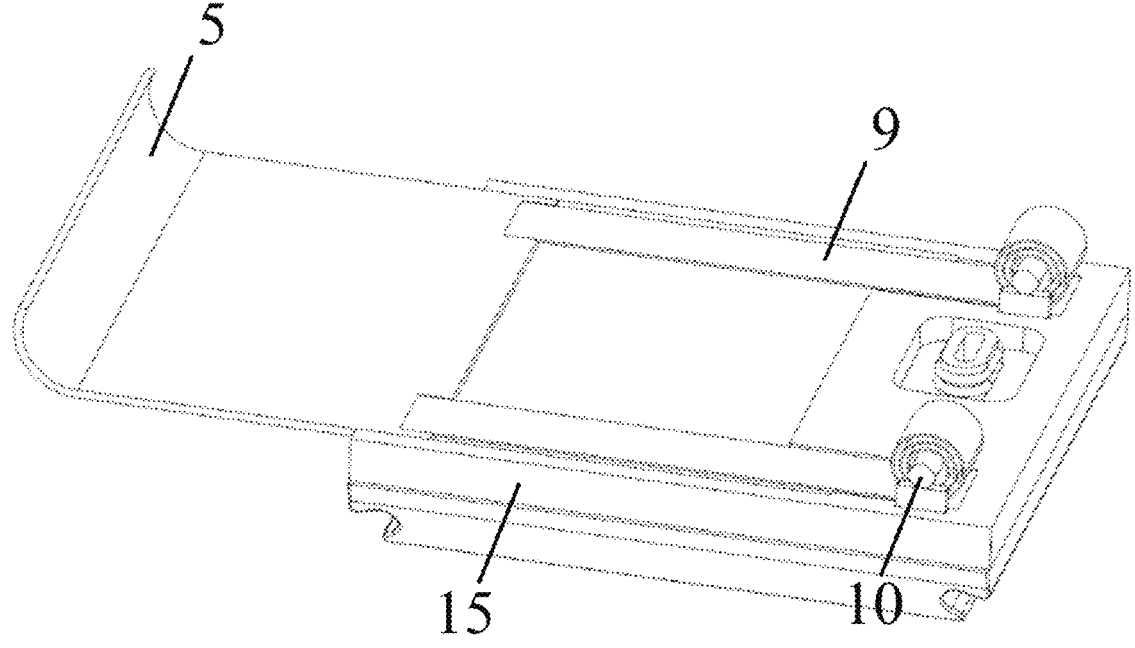
FIG. 10 illustrates a tensioning mechanism for a flexible display panel in a display apparatus in some embodiments according to the present disclosure.

FIG. 8 is an exploded view of a flexible display panel, a push rod, a housing, and a first bonding structure in a display apparatus in some embodiments according to the present disclosure. FIG. 9 is cross-sectional view along a C-C' line in FIG. 8. FIG. 10 illustrates a tensioning mechanism for a flexible display panel in a display apparatus in some embodiments according to the present disclosure. In some embodiments, the flexible display panel 5 bends about a support portion of the push rod 6.

In some embodiments, a portion of the flexible display panel 5 corresponding to the second display area 2 is bonded to the housing 7 by the first bonding structure 8. In some embodiments, the flexible display panel 5 includes a pad bending area 5-1. Optionally, the pad bending area 5-1 is bonded to the housing 7 by the first bonding structure 8, ensuring a sealed enclosure for the electronic components in the pad bending area 5-1.

In some embodiments, the housing 7 further includes a second groove 7-4 configured to at least partially receive the first bonding structure 8. The first bonding structure 8 at least partially extends into, and attaches to, the second groove 7-4 of the housing 7.

In some embodiments, the display apparatus further includes a first opening 7-2 extending through a side of the housing 7. In some embodiments, the display apparatus further includes a flexible printed circuit FPC connected to the flexible display panel 5, and connected to the mainboard 17 received in the first chamber c1. In some embodiments, the flexible printed circuit FPC extends through the first opening 7-2 into the first chamber c1 to connect to the mainboard 17.

Referring to FIG. 10, the display apparatus in some embodiments further includes a coil spring 9 and a pin shaft 10. Optionally, the pin shaft 10 is configured to attach the coil spring 9 to the housing. Optionally, the pin shaft 10 is movably attached to the housing 7. A first portion of the coil spring 9 is attached to the pin shaft 10, and a second portion of the coil spring 9 is attached to the flexible display panel 5, providing a tensioning mechanism for the flexible display panel 5. In one example, the coil spring 9 is attached to the flexible display panel 5 using an adhesive. In another example, the coil spring 9 is attached to the flexible display panel 5 using a positioning pin.

Various alternative implementations may be practiced in the present disclosure. In an alternative embodiment, a taut rope may be used as the tensioning mechanism instead of the coil spring. A first portion of the taut rope is attached to the pin shaft, and a second portion of the taut rope is attached to the flexible display panel, providing a tensioning mechanism for the flexible display panel.

Figure 11:
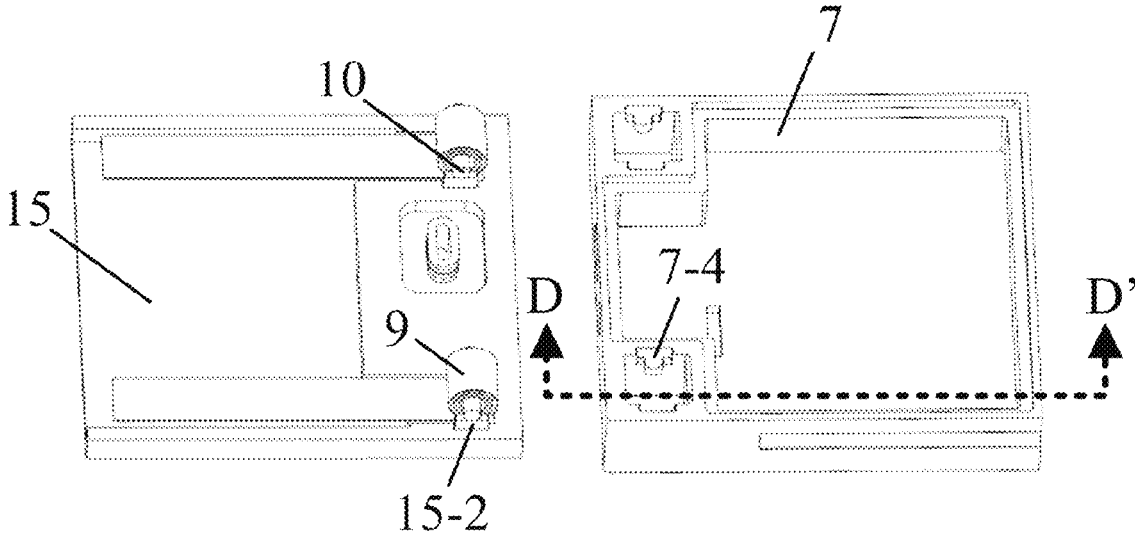
FIG. 11 is a diagram illustrating a coil spring assembly in a display apparatus in some embodiments according to the present disclosure.
Figure 12:
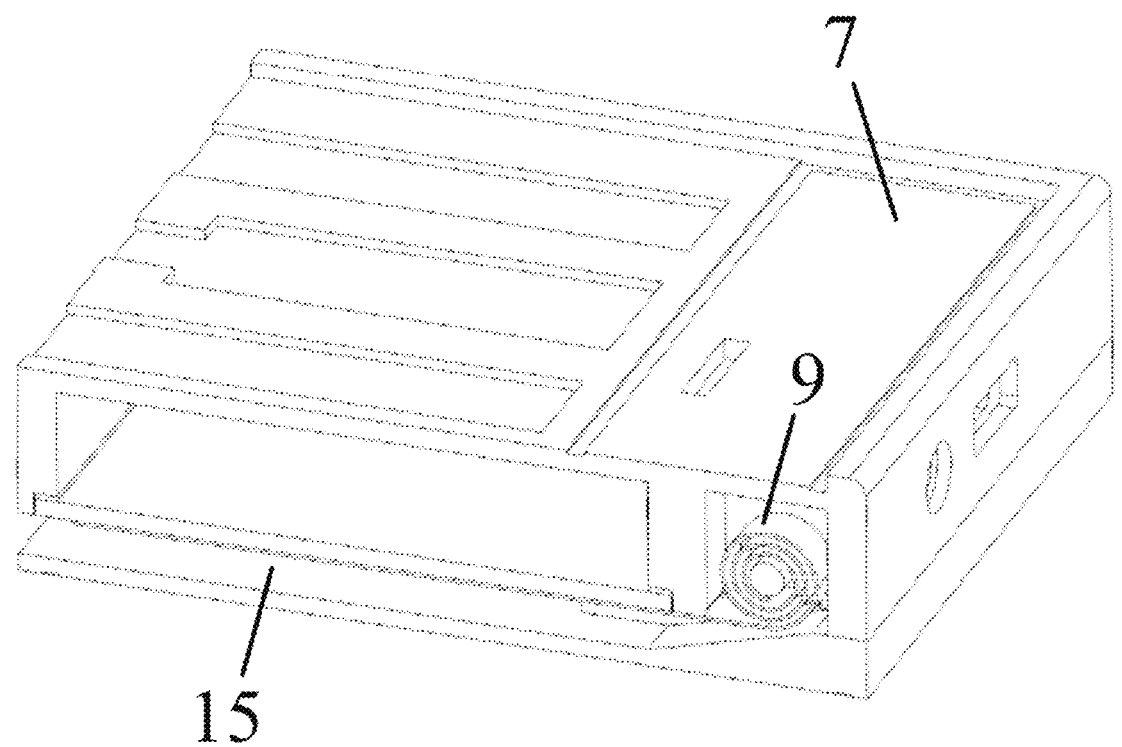
FIG. 12 is a perspective view of a portion of a display apparatus assembled by a coil spring assembly depicted in FIG. 11.
Figure 13:
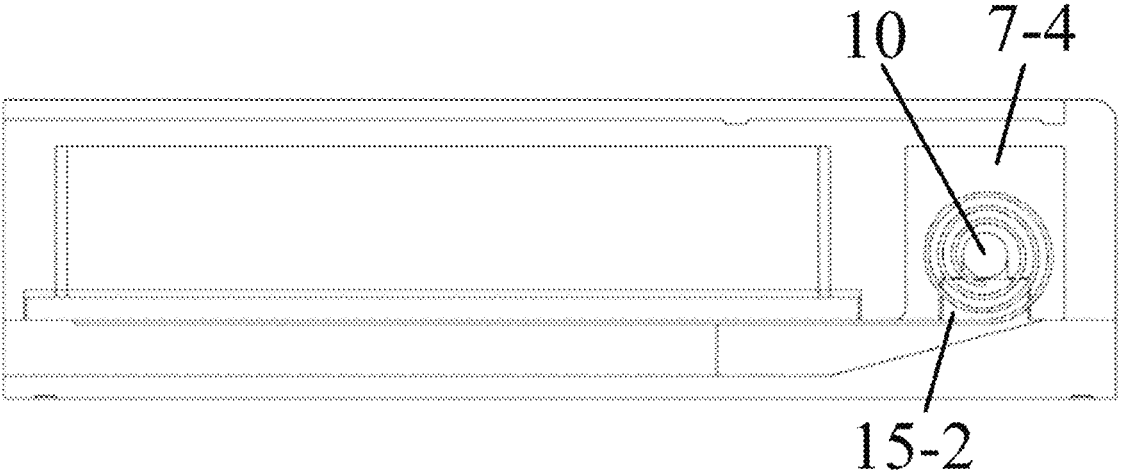
FIG. 13 is a cross-sectional view along a D-D' line in FIG. 1*t* when the second cover plate, the housing, the coil spring, and the pin shaft are assembled together and the assembly is flipped upside down.

FIG. 11 is a diagram illustrating a coil spring assembly in a display apparatus in some embodiments according to the present disclosure. FIG. 12 is a perspective view of a portion of a display apparatus assembled by a coil spring assembly depicted in FIG. 11. FIG. 13 is a cross-sectional view along a D-D' line in FIG. 11 when the second cover plate, the housing, the coil spring, and the pin shaft are assembled together and the assembly is flipped upside down. Similarly, FIG. 12 shows a perspective view of the portion of a display apparatus when the second cover plate 15, the housing 7, the coil spring 9, and the pin shaft 10 are assembled together and the assembly is flipped upside down. A first side (e.g., an inner side) of the housing 7 is shown in FIG. 11, and a second side (e.g., an outer side) of the housing 7 is shown in FIG. 12 and FIG. 13. Referring to FIG. 11 to FIG. 13, the second cover plate 15 in some embodiments includes a second protrusion 15-2, and the housing 7 in some embodiments includes a third groove 7-4. The second protrusion 15-2 and the third groove 7-4 are configured to interlock with each other, securing the pin shaft 10. The pin shaft 10 passes through the coil spring 9, achieving fixation of the coil spring 9.

Figure 14:
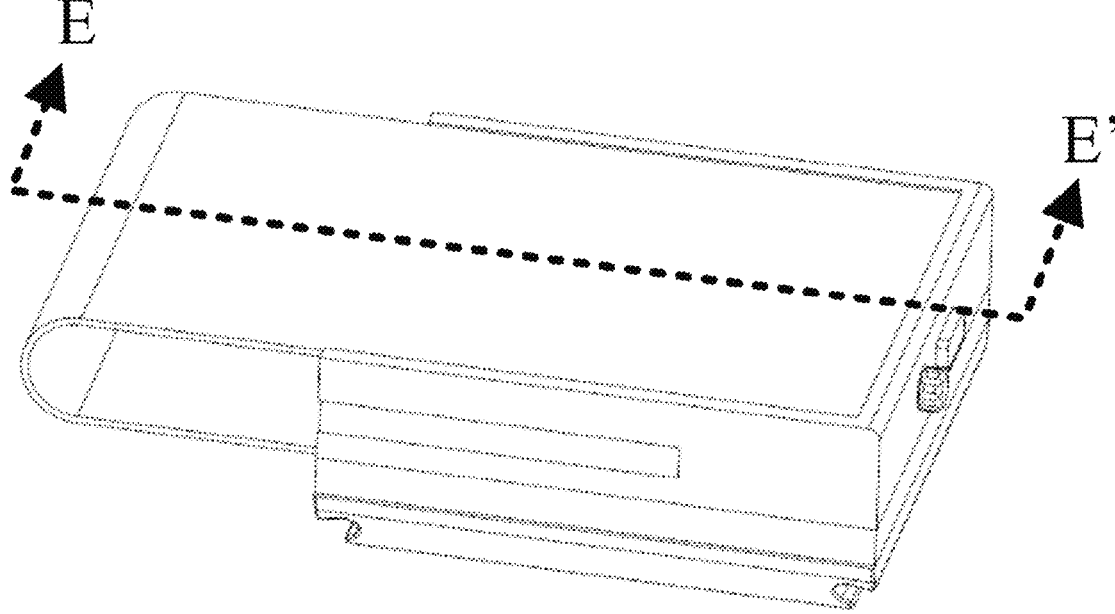
FIG. 14 is a perspective view of a portion of a display apparatus in some embodiments according to the present disclosure.
Figure 15:
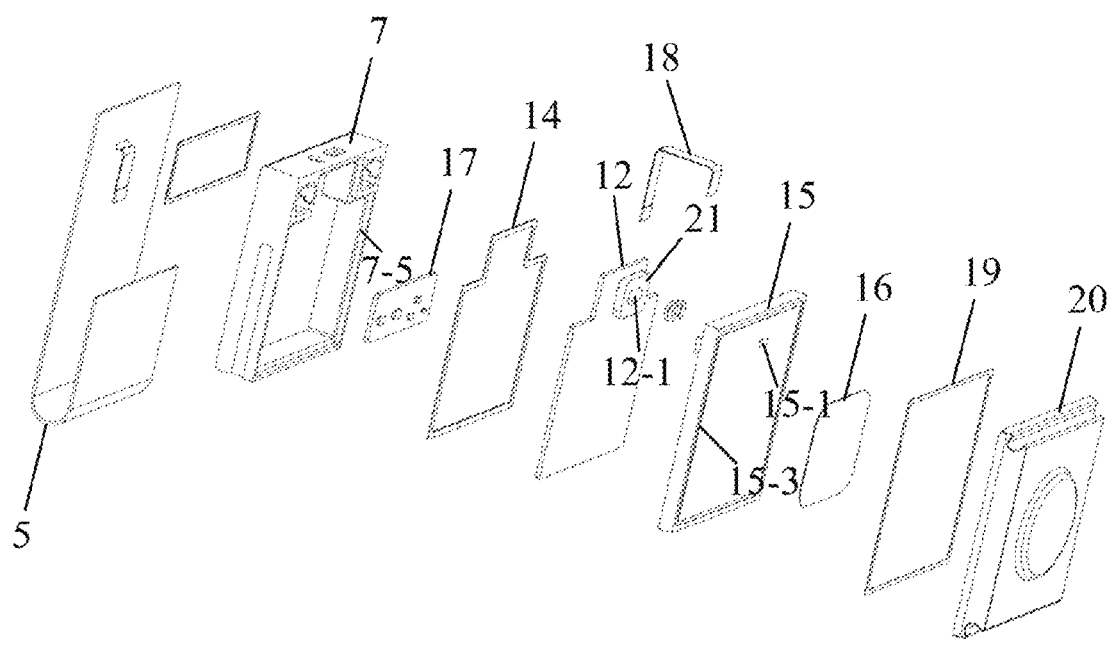
FIG. 15 is an exploded view of the portion of a display apparatus depicted in FIG. 14.
Figure 16:
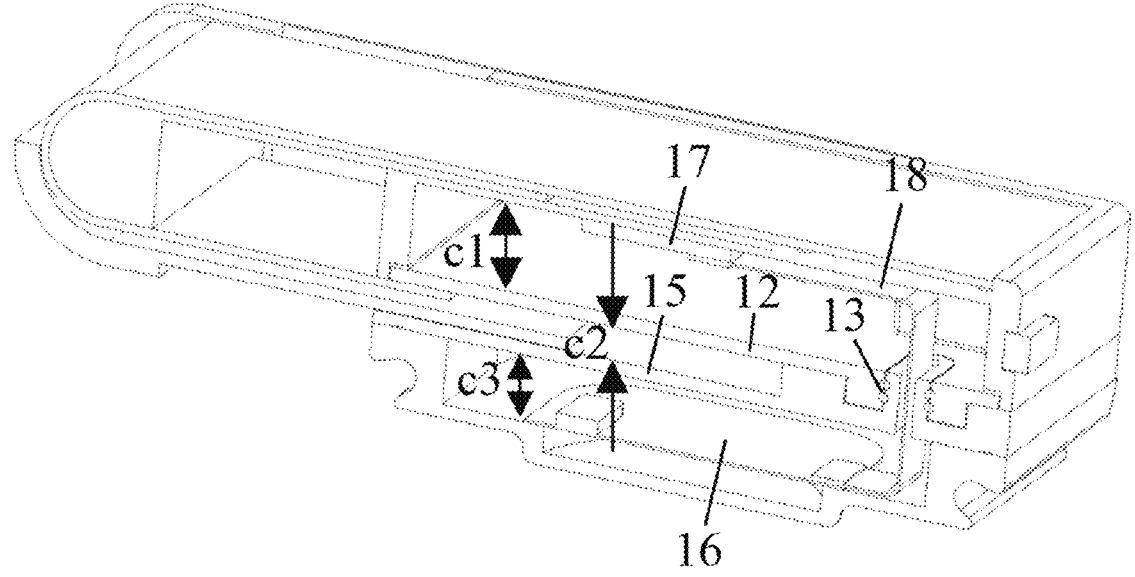
FIG. 16 is cross-sectional view along a E-E' line in FIG. 14.

FIG. 14 is a perspective view of a portion of a display apparatus in some embodiments according to the present disclosure. FIG. 15 is an exploded view of the portion of a display apparatus depicted in FIG. 14. FIG. 16 is cross-sectional view along a E-E' line in FIG. 14. Referring to FIG. 14 to FIG. 16, in some embodiments, the mainboard 17 is attached to (e.g., fixedly attached to) the housing 7. In one example, the mainboard 17 is attached to the housing 7 by an adhesive. In another example, the mainboard 17 is bolted to the housing 7.

In some embodiments, the housing 7 further includes a fourth groove 7-5 configured to receive the second bonding structure 14. The second bonding structure 14 is configured to attach the first cover plate 12 to the housing 7, thereby forming the first chamber c1. In some embodiments, the first cover plate 12 is attached to the housing 7 by a combination of the second bonding structure 14 and a bolt.

In some embodiments, the first cover plate 12 is attached to the second cover plate 15, thereby forming the second chamber c2.

In some embodiments, the back plate 20 is attached to the second cover plate 15 by the third bonding structure 19, thereby forming the third chamber c3. In some embodiments, the second cover plate 15 further includes a fifth groove 15-3 configured to receive the third bonding structure 19.

Referring to FIG. 3, the display apparatus in some embodiments further includes a second opening 12-1 extending through the first cover plate 12 and a third opening 15-1 extending through the second cover plate 15. Optionally, the third opening 15-1 is at least partially in the second opening 12-1.

In some embodiments, the first cover plate 12 includes a first tubular structure 21 protruding toward the second cover plate 15. The second opening 12-1 is the opening of the first tubular structure 21. Optionally, the second cover plate 15 includes a second tubular structure 22 protruding toward the first cover plate 12. The third opening 15-1 is the opening of the second tubular structure 22. Optionally, the second tubular structure 22 is inserted into the first tubular structure 21. In some embodiments, the transfer flexible printed circuit 18 extends from the first chamber c1, through the third opening 15-1, and then into the third chamber c3.

Figure 17:
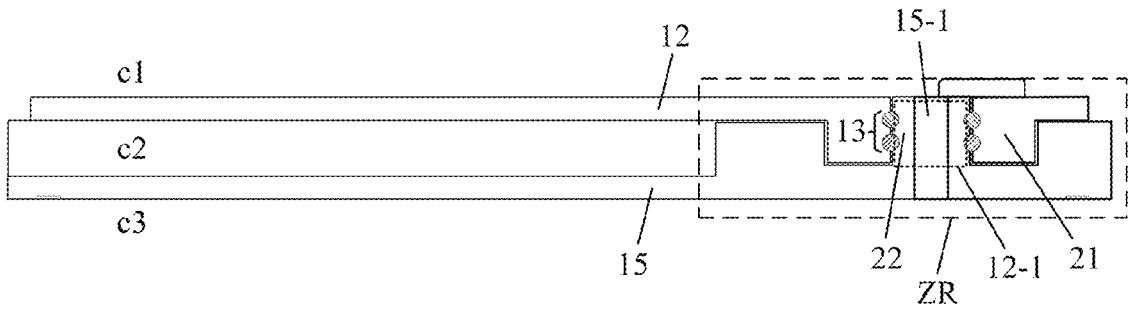
FIG. 17 illustrates a waterproofing mechanism in a display apparatus in some embodiments according to the present disclosure.
Figure 18:
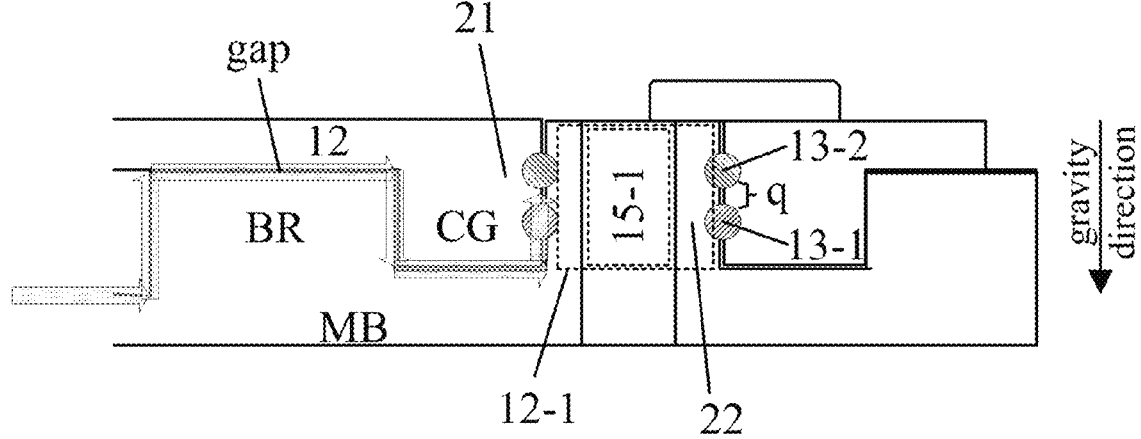
FIG. 18 is a zoom-in view of a zoom-in region ZR depicted in FIG. 17.

FIG. 17 illustrates a waterproofing mechanism in a display apparatus in some embodiments according to the present disclosure. FIG. 18 is a zoom-in view of a zoom-in region ZR depicted in FIG. 17. Referring to FIG. 17 and FIG. 18, the shaded arrow denotes a hypothetical water infiltration path that is blocked by the waterproofing mechanism in the display apparatus. As shown in FIG. 17 and FIG. 18, the water in the hypothetical water infiltration path would have to first overcome force of gravity (as indicated by the second shaded arrow in FIG. 18) to flow from the second chamber c2 into a gap between the second cover plate 15 and the first cover plate 12. Assuming the water overcomes the gravity, and passes through the gap, the water would have to overcome several additional barriers in order to enter into the first chamber c1. First, the water passing through the gap would have to overcome the force of gravity again in order to enter into the first chamber c1 (as indicated by the last shaded arrow in FIG. 18). Second, the water overcoming the force of gravity would have to overcome the barrier of a first sealing ring 13-1 which is an interference fit sealing ring. Third, the water passing through the first sealing ring 13-1 would have to overcome the barrier of a second sealing ring 13-2 which is also an interference fit sealing ring. In addition, the display apparatus further includes a water storage space q between the first sealing ring 13-1 and the second sealing ring 13-2. The water storage space q provides a buffer for, if any, the water passing through the first sealing ring 13-1 before it encounters the second sealing ring 13-2. The water storage space q further prevents high pressure water from passing through the first sealing ring 13-1 and the second sealing ring 13-2 due to the high pressure.

In some embodiments, the display apparatus further includes a hydrophobic material layer coated on an inner wall of the second chamber c2. Optionally, the hydrophobic material layer is both hydrophobic and oleophobic. Examples of appropriate materials for making the hydrophobic material layer include fluoropolymer materials. In case water enters the second chamber c2, a user may tilt the display apparatus to cause the water to flow out rapidly.

Referring to FIG. 1 to FIG. 18, the display apparatus in some embodiments includes a housing 7, a first cover plate 12, a second cover plate 15, and a back plate 20. The display apparatus includes a first chamber c1 between the housing 7 and the first cover plate 12, a second chamber c2 between the first cover plate 12 and the second cover plate 15, and a third chamber c3 between the second cover plate 15 and the back plate 20. Optionally, the first chamber c1 is a waterproof chamber. Optionally, the third chamber c3 is a waterproof chamber.

In some embodiments, referring to FIG. 1 to FIG. 18, the display apparatus further includes a second opening 12-1 extending through the first cover plate 12, a third opening 15-1 extending through the second cover plate 15, a first sealing ring 13-1, and a second sealing ring 13-2. Optionally, the third opening 15-1 is at least partially in the second opening 12-1. Optionally, the third opening connects the first chamber c1 and the third chamber c3.

In some embodiments, the first cover plate 12 includes a first tubular structure 21 protruding toward the second cover plate 15. The second opening 12-1 is the opening of the first tubular structure 21. Optionally, the second cover plate 15 includes a second tubular structure 22 protruding toward the first cover plate 12. The third opening 15-1 is the opening of the second tubular structure 22. Optionally, the second tubular structure 22 is inserted into the first tubular structure 21. Optionally, the first sealing ring 13-1 and the second sealing ring 13-2 are between an inner wall of the first tubular structure 21 and an outer wall of the second tubular structure 22, preventing water from passing through a space between the inner wall of the first tubular structure 21 and the outer wall of the second tubular structure 22. Optionally, the first sealing ring 13-1 and the second sealing ring 13-2 are in direct contact with the inner wall of the first tubular structure 21, and in direct contact with the outer wall of the second tubular structure 22.

In some embodiments, referring to FIG. 17 and FIG. 18, the second cover plate 15 includes a barrier BR and a main body MB, the barrier BR protruding away from the main body MB toward the first cover plate 12. The barrier BR is in direct contact with the first cover plate 12.

In some embodiments, referring to FIG. 17 and FIG. 18, the display apparatus includes a concave groove CG extending into the second cover plate 15, the barrier BR spaces apart the second chamber c2 from the concave groove CG. A portion of the first cover plate 12 extends into the concave groove CG, thereby interlocking with the second cover plate 15. The portion of the first cover plate 12 extending into the concave groove CG is at least partially in contact with the first sealing ring 13-1 and is at least partially in contact with the second sealing ring 13-2.

In some embodiments, referring to FIG. 17 and FIG. 18, the display apparatus further includes a water storage space between the first sealing ring 13-1 and the second sealing ring 13-2 configured to further prevent water from passing through the second sealing ring 13-2.

In some embodiments, referring to FIG. 1 to FIG. 18, the display apparatus further includes a mainboard 17 received in the first chamber c1, an adapter board 16 received in the third chamber c3, and a transfer flexible printed circuit 18 connected to the mainboard 17 received in the first chamber c1 and connected to the adapter board 16 received in the third chamber c3. Optionally, the transfer flexible printed circuit 18 extends from the first chamber c1, through the third opening 15-1, and then into the third chamber c3.

In some embodiments, referring to FIG. 1 to FIG. 18, the display apparatus further includes a second bonding structure 14 configured to fixedly attach the first cover plate 12 to the housing 7, thereby forming the first chamber c1.

In some embodiments, referring to FIG. 1 to FIG. 18, housing 7 further includes a fourth groove 7-5 configured to receive the second bonding structure 14.

In some embodiments, referring to FIG. 1 to FIG. 18, the display apparatus further includes a third bonding structure 19 configured to fixedly attach the back plate 20 to the second cover plate 15, thereby forming the third chamber c3.

In some embodiments, referring to FIG. 1 to FIG. 18, the second cover plate 15 further includes a fifth groove 15-3 configured to receive the third bonding structure 19.

In some embodiments, referring to FIG. 1 to FIG. 18, the display apparatus further includes a flexible display panel 5 configured to transition between a folded state and an unfolded state, a push rod 6, and a housing 7. Optionally, the push rod 6 and the housing 7 are cooperatively configured to transition the flexible display panel 5 between the folded state and the unfolded state. Optionally, the second chamber c2 is configured to receive a portion of the flexible display panel 5.

In some embodiments, the flexible display panel 5 bends about a support portion of the push rod 6, the push rod 6 is slidably attached to the housing 7, and the push rod 6 is slidably movable relative to the housing 7. Optionally, the flexible display panel 5 is configured to transition between the folded state and the unfolded state as the push rod 6 slidably moves relative to the housing 7.

In some embodiments, referring to FIG. 1 to FIG. 18, the display apparatus further includes a first bonding structure 8 configured to fixedly attach the flexible display panel 5 to the housing 7. Optionally, the first bonding structure 8 is configured to form a sealed chamber between the flexible display panel 5 and the housing 7. Optionally, the flexible display panel 5 includes a pad bending area 5-1. Optionally, the first bonding structure 8 is configured to fixedly attach the pad bending area 5-1 of the flexible display panel 5 to a frame portion of the housing 7.

In some embodiments, the housing 7 further includes a second groove 7-4 configured to at least partially receive the first bonding structure 8. The first bonding structure 8 at least partially extends into, and attaches to, the second groove 7-4 of the housing 7.

In some embodiments, the push rod 6 is a push rod having a comb shape comprising multiple teeth 6-1. In some embodiments, the housing 7 includes multiple slots 7-1 configured to receive the multiple teeth 6-1 of the push rod 6. In some embodiments, the outer casing 4 moves along with the push rod 6 as the push rod 6 slidably moves relative to the housing 7. Optionally, at least one of the multiple teeth 6-1 of the push rod 6 includes a start-stop limit structure 6-2 configured to define the limits of the slidable movement of the push rod 6 relative to the housing 7.

In some embodiments, referring to FIG. 1 to FIG. 18, the display apparatus further includes an outer casing 4 attached to the housing 7 and attached to the push rod 6. Optionally, the outer casing 4 wraps around a portion of the flexible display panel 5 that bends about the support portion of the push rod 6. Optionally, the outer casing 4 further wraps around at least a portion of the first display area 1 when the portion of the first display area 1 is retracted. Optionally, the outer casing 4 further wraps around side edges of the flexible display panel 5.

In some embodiments, the outer casing 4 includes a first protrusion 4-2, and the housing 7 includes a first groove 7-3. Optionally, the first protrusion 4-2 and the first groove 7-3 are configured to interlock with each other, thereby attaching the outer casing 4 to the housing 7. Optionally, the first groove 7-3 is a blind groove.

In some embodiments, referring to FIG. 1 to FIG. 18, the second cover plate 15 is configured to cover at least a portion of the first display area 1 when the portion of the first display area 1 is retracted. Optionally, the second cover plate 15 is attached to the first cover plate 12.

In some embodiments, referring to FIG. 1 to FIG. 18, the display apparatus further includes a coil spring 9 and a pin shaft 10. Optionally, the pin shaft 10 is configured to attach the coil spring 9 to the housing. Optionally, the pin shaft 10 is movably attached to the housing 7. A first portion of the coil spring 9 is attached to the pin shaft 10, and a second portion of the coil spring 9 is attached to the flexible display panel 5, providing a tensioning mechanism for the flexible display panel 5. Optionally, the coil spring 9 and the pin shaft 10 are received in the second chamber c2. Optionally, the second cover plate 15 includes a second protrusion 15-2, and the housing 7 includes a third groove 7-4. The second protrusion 15-2 and the third groove 7-4 are configured to interlock with each other, securing the pin shaft 10. The pin shaft 10 passes through the coil spring 9, achieving fixation of the coil spring 9.

In some embodiments, referring to FIG. 1 to FIG. 18, the display apparatus further includes a first opening 7-2 extending through a side of the housing 7, and a flexible printed circuit FPC connected to the flexible display panel 5, and connected to the mainboard 17 received in the first chamber c1. Optionally, the flexible printed circuit FPC extends through the first opening 7-2 into the first chamber c1 to connect to the mainboard 17.

In some embodiments, referring to FIG. 1 to FIG. 18, the display apparatus further includes an adapter board 16 and one or more health monitoring sensors. Optionally, the third chamber c3 is configured to receive the adapter board 16 and the one or more health monitoring sensors.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display apparatus, comprising:
   a housing;
   a first cover plate;
   a second cover plate;
   a back plate;
   a first chamber between the housing and the first cover plate;
   a second chamber between the first cover plate and the second cover plate; and
   a third chamber between the second cover plate and the back plate;
   wherein the first chamber is a waterproof chamber; and the third chamber is a waterproof chamber;
   wherein the display apparatus further comprises:
   a second opening extending through the first cover plate; and
   a third opening extending through the second cover plate;
   wherein the third opening connects the first chamber and the third chamber; and
   the third opening is at least partially in the second opening.

2. The display apparatus of claim 1, wherein the second cover plate comprises a barrier and a main body, the barrier protruding away from the main body toward the first cover plate; and
   the barrier is in direct contact with the first cover plate, enclosing the second chamber.

3. The display apparatus of claim 2, further comprising a concave groove extending into the second cover plate;

wherein the barrier spaces apart the second chamber from the concave groove;

a portion of the first cover plate extends into the concave groove, interlocking with the second cover plate; and the portion of the first cover plate extending into the concave groove is at least partially in contact with a first sealing ring and is at least partially in contact with a second sealing ring.

4. The display apparatus of claim 1, wherein the first cover plate comprises a first tubular structure protruding toward the second cover plate, the second opening being an opening of the first tubular structure;

the second cover plate comprises a second tubular structure protruding toward the first cover plate, the third opening being an opening of the second tubular structure; and the second tubular structure is inserted into the first tubular structure.

5. The display apparatus of claim 4, further comprising a first sealing ring and a second sealing ring between an inner wall of the first tubular structure and an outer wall of the second tubular structure, preventing water from passing through between the inner wall of the first tubular structure and the outer wall of the second tubular structure.

6. The display apparatus of claim 5, further comprising a water storage space between the first sealing ring and the second sealing ring configured to further prevent water from passing through the second sealing ring.

7. The display apparatus of claim 1, further comprising:

a mainboard received in the first chamber;

an adapter board received in the third chamber; and a transfer flexible printed circuit connected to the mainboard received in the first chamber and connected to the adapter board received in the third chamber;

wherein the transfer flexible printed circuit extends from the first chamber, through the third opening, and into the third chamber.

8. The display apparatus of claim 1, further comprising a second bonding structure configured to fixedly attach the first cover plate to the housing, thereby forming the first chamber;

wherein the housing further comprises a fourth groove configured to receive the second bonding structure.

9. The display apparatus of claim 1, further comprising a third bonding structure configured to fixedly attach the back plate to the second cover plate, thereby forming the third chamber;

wherein the second cover plate further comprises a fifth groove configured to receive the third bonding structure.

10. The display apparatus of claim 1, further comprising:

a flexible display panel configured to transition between a folded state and an unfolded state; and a push rod;

wherein the push rod and the housing are cooperatively configured to transition the flexible display panel between the folded state and the unfolded state; and the second chamber is configured to receive a portion of the flexible display panel.

11. The display apparatus of claim 10, wherein the flexible display panel bends about a support portion of the push rod;

the push rod is slidably attached to the housing;

the push rod is slidably movable relative to the housing; and the flexible display panel is configured to transition between the folded state and the unfolded state as the push rod slidably moves relative to the housing.

12. The display apparatus of claim 10, wherein the push rod is a push rod having a comb shape comprising multiple teeth;

the housing comprises multiple slots configured to receive the multiple teeth of the push rod; and at least one of the multiple teeth of the push rod comprises a start-stop limit structure configured to define the limits of the slidable movement of the push rod relative to the housing.

13. The display apparatus of claim 1, further comprising a first bonding structure configured to attach the flexible display panel to the housing; and the first bonding structure is configured to form a sealed chamber between the flexible display panel and the housing.

14. The display apparatus of claim 13, wherein the flexible display panel comprises a pad bending area; and the first bonding structure is configured to fixedly attach the pad bending area of the flexible display panel to a frame portion of the housing.

15. The display apparatus of claim 13, wherein the housing further comprises a second groove configured to at least partially receive the first bonding structure; and the first bonding structure at least partially extends into, and attaches to, the second groove of the housing.

16. The display apparatus of claim 1, further comprising:

a push rod; and an outer casing attached to the housing and attached to the push rod;

wherein the display apparatus has a first display area and a second display area; and the first display area is capable of sliding open to increase a total display area of the display apparatus, or retracting to decrease the total display area of the display apparatus;

wherein the outer casing wraps around a portion of the flexible display panel that bends about the support portion of the push rod;

the outer casing further wraps around at least a portion of the first display area when the portion of the first display area is retracted; and the outer casing further wraps around side edges of the flexible display panel.

17. The display apparatus of claim 16, wherein the outer casing comprises a first protrusion;

the housing comprises a first groove;

the first protrusion and the first groove are configured to interlock with each other, thereby attaching the outer casing to the housing; and the first groove is a blind groove.

18. The display apparatus of claim 1, further comprising:

a coil spring; and a pin shaft;

wherein the pin shaft is configured to attach the coil spring to the housing;

the pin shaft is movably attached to the housing;

a first portion of the coil spring is attached to the pin shaft, a second portion of the coil spring is attached to the flexible display panel, providing a tensioning mechanism for the flexible display panel; and the coil spring and the pin shaft are received in the second chamber.

19. The display apparatus of claim 18, wherein the second cover plate comprises a second protrusion;

the housing comprises a third groove;

the second protrusion and the third groove are configured to interlock with each other, securing the pin shaft; and the pin shaft passes through the coil spring, achieving fixation of the coil spring.

20. The display apparatus of claim 1, further comprising:

a mainboard received in the first chamber;

a first opening extending through a side of the housing; and a flexible printed circuit connected to the flexible display panel, and connected to the mainboard;

wherein the flexible printed circuit extends through the first opening into the first chamber to connect to the mainboard.

* * * * *